US009805828B1

(12) United States Patent
Yoko

(10) Patent No.: US 9,805,828 B1
(45) Date of Patent: Oct. 31, 2017

(54) MEMORY APPARATUS WITH POST PACKAGE REPAIR

(71) Applicant: Micron Technology, Inc., Boise, ID (US)

(72) Inventor: Hideyuki Yoko, Fukuoka (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/438,459

(22) Filed: Feb. 21, 2017

(51) Int. Cl.
*G11C 7/00* (2006.01)
*G11C 29/00* (2006.01)
*G11C 17/16* (2006.01)
*G11C 17/18* (2006.01)

(52) U.S. Cl.
CPC .............. *G11C 29/78* (2013.01); *G11C 17/16* (2013.01); *G11C 17/18* (2013.01); *G11C 29/76* (2013.01)

(58) Field of Classification Search
CPC ....... G11C 7/1051; G11C 7/1078; G11C 7/22; G11C 7/106; G11C 7/1057
USPC ................................. 365/200, 225.7, 189.05
See application file for complete search history.

(56) References Cited

U.S. PATENT DOCUMENTS

| 8,223,575 B2 * | 7/2012 | Lin ...................... G11C 11/5692 327/525 |
| 8,638,596 B2 * | 1/2014 | Kim ...................... G11C 29/846 365/158 |
| 9,349,491 B1 | 5/2016 | Morgan et al. |

OTHER PUBLICATIONS

JEDEC Standard No. 209-4A, Nov. 2015, pp. 225-226.

* cited by examiner

*Primary Examiner* — Son Dinh
(74) *Attorney, Agent, or Firm* — Dorsey & Whitney LLP

(57) ABSTRACT

Apparatuses for memory repair for a memory device are described. An example apparatus includes: a non-volatile storage element that stores information; a storage latch circuit coupled to the non-volatile storage element and stores latch information; and a control circuit that, in a first repair mode, receives first repair address information, provides the first repair address information to the non-volatile storage element, and further transmits the first repair address information from the non-volatile storage element to the storage latch circuit. The control circuit, in a second repair mode, receives second repair address information and provides the second repair address information to the storage latch circuit and disables storing the second address information into the non-volatile storage element.

20 Claims, 11 Drawing Sheets

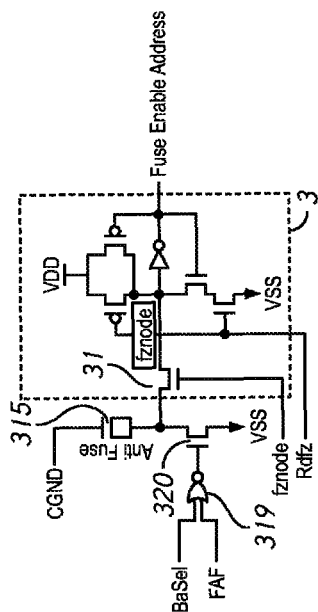
FIG. 3A
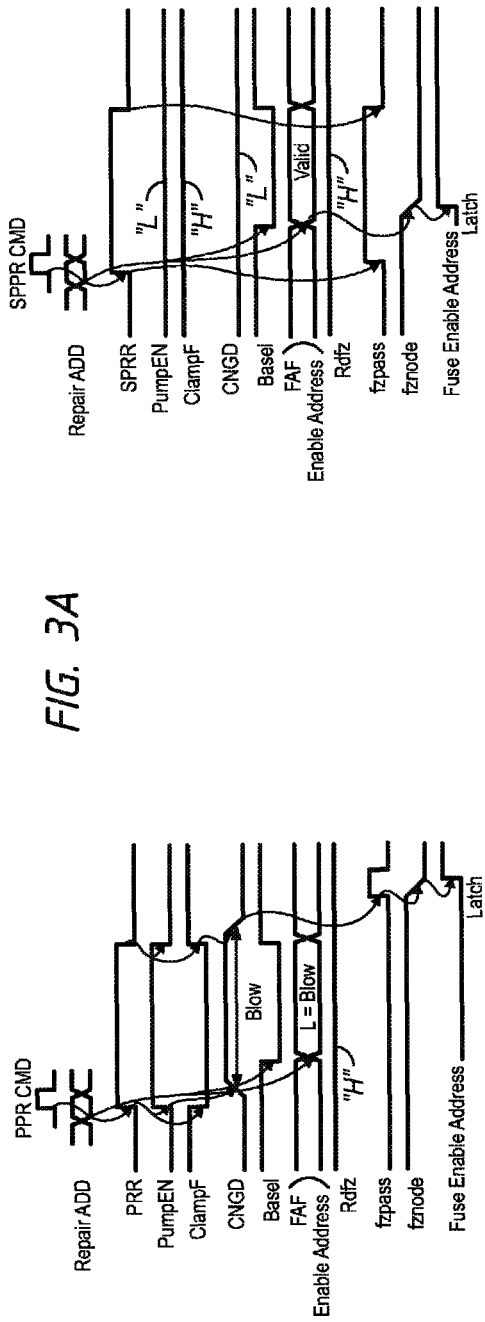
FIG. 3B
FIG. 3C

| PreInfo(k) | fzsetEn(k+1) | Fuse Set <k+1> |
|---|---|---|
| L | L | To be selected |
| L | H | Already in use (Disabled) |
| H | L | To be unselected (Fuse Set <k> available) |
| H | H | Already in use (Disabled) |

FIG. 5B

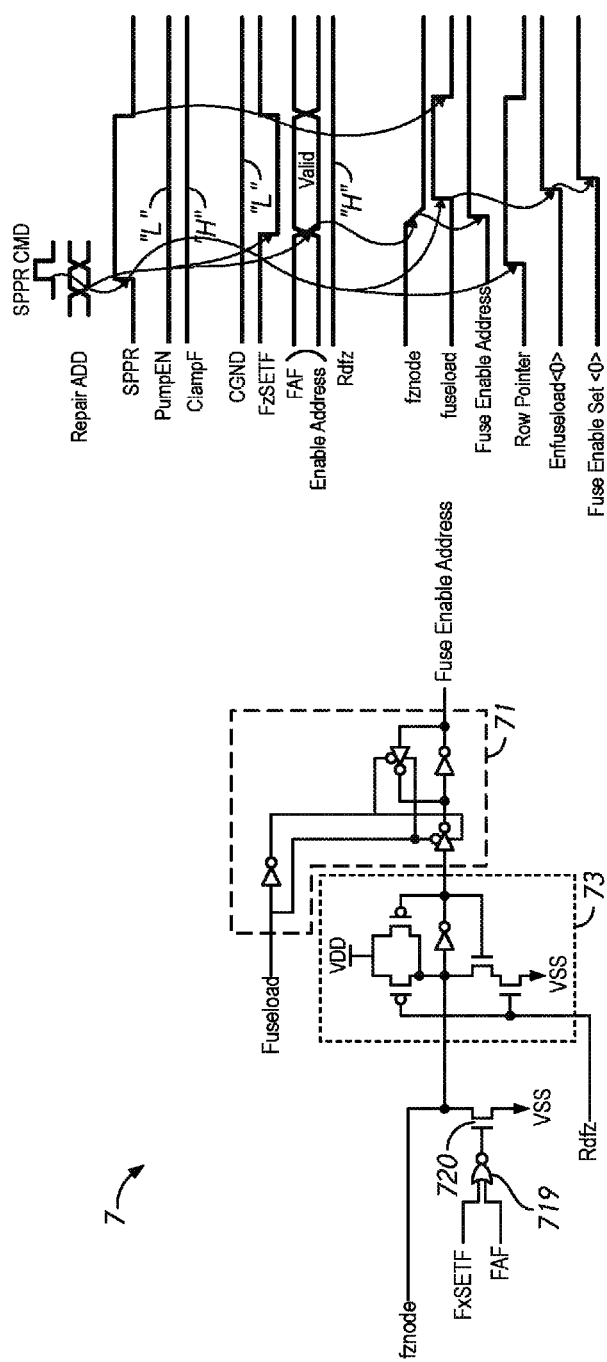

MEMORY APPARATUS WITH POST PACKAGE REPAIR

BACKGROUND

In a semiconductor memory device, memory cells may be susceptible to errors based on a transient error or a soft error. The errors may be due to a transient error caused by noises from surrounding components in the device with high-density. Soft errors may be caused by background radiation. The semiconductor memory device may execute a test mode for dynamic random access memory (DRAM), in order to detect and correct errors. For example, memories have been developed that include redundant rows or columns to replace defective memory cells with errors.

For example, a semiconductor memory device may support fail row address repair, so called Post Package Repair (PPR) that is a hard repair of one fail row per memory bank (hereinafter, "bank") using antifuses. For example, an antifuse may have a high resistance in its initial state, and can permanently create an electrically conductive path ("blow an antifuse") when a relatively high voltage is applied across the antifuse. For example, an antifuse can have a structure similar to that of a capacitor, i.e., two conductive electrical terminals are separated by a dielectric layer, that may be broken down by blowing the antifuse.

Additionally, Soft Post Package Repair (SPPR) for repair of one row per bank may be supported. Soft post package repair can refer to a non-persistent method of post package repair. In soft post package repair, defective address data can be stored in volatile memory of the semiconductor memory device after the memory device is packaged. The defective address data can, for example, correspond to a group of memory cells that were identified as defective post packaging. In some cases, the group of memory cells identified as defective post packaging could be a group of redundant memory cells to which an address has been previously remapped. In such cases, other defective address data can already be stored in programmable elements, such as antifuses, so that memory cells associated with the other defective address data are not accessed. The defective address data can be stored as part of a power-up sequence of a semiconductor memory device, for example. The defective address data can be stored in volatile memory until the semiconductor memory device is powered down. A storage element comprising volatile memory, such as latches, registers, and/or flip-flops, can store the defective address data and a decoder can map the defective address to another group of memory cells. The other group of memory cells can be a group of redundant memory cells (e.g., a column or row of redundant memory cells) that are dedicated to soft post package repair.

Typically, a conventional semiconductor memory device (e.g., LPDDR4) may include standard antifuses that are dedicated to the PPR functionality, as the PPR has been used for permanent repair of a defective row by blowing a corresponding antifuse. Registers for the SPPR may be separately provided, since performing the SPPR is optional after performing the PPR. Performing the PPR and the SPPR may require a lot of storage space for antifuses and registers, and an effective array usage method may be desired to improve a yield on a wafer.

BRIEF DESCRIPTION OF THE DRAWINGS

FIG. 3A is a circuit diagram of an antifuse latch circuit in accordance with an embodiment of the present disclosure.

FIG. 3B is a timing diagram of signals in the antifuse latch circuit in a PPR operation in accordance with an embodiment of the present disclosure.

FIG. 3C is a timing diagram of signals in the antifuse latch circuit in an SPPR operation in accordance with an embodiment of the present disclosure.

FIG. 5B is a table of a selection status of the fuse set <k+1> in the post package repair circuit responsive to a combination of the Preinfo <k> signal and the fzsetEn(k+1) signal, in accordance with an embodiment of the present disclosure.

FIG. 7A is a circuit diagram of an antifuse latch circuit in accordance with an embodiment of the present disclosure.

FIG. 7B is a timing diagram of signals in the antifuse latch circuit in an SPPR operation in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
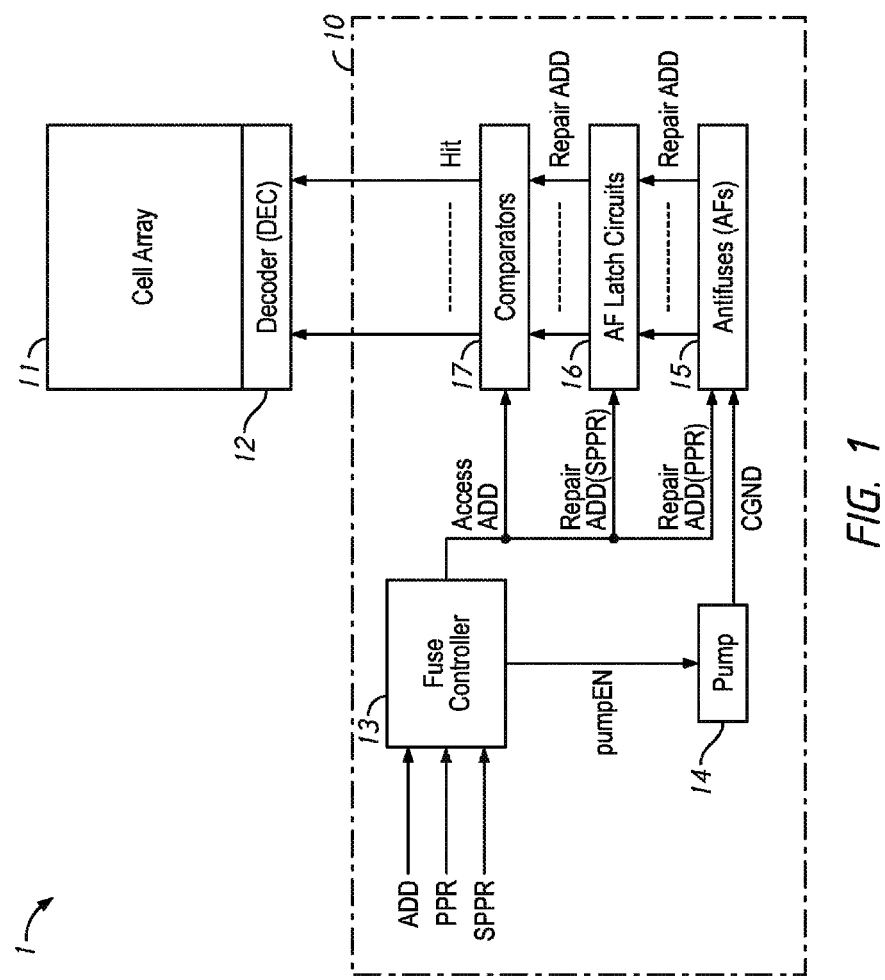
FIG. 1 is a schematic diagram of a post package repair circuit in a semiconductor memory device in accordance with an embodiment of the present disclosure.

FIG. 1 is a schematic diagram of a post package repair circuit 10 in a semiconductor memory device 1 in accordance with an embodiment of the present disclosure. For example, the semiconductor memory device 1 may include post package repair circuit 10, at least one cell array 11 and a decoder 12 for the cell array 11. The at least one cell array 11 may include "redundant" groups (e.g., rows, columns) of memory cells that can be used to replace defective groups (e.g., rows, columns) of memory cells. The decoder 12 may be a row decoder and/or a column decoder.

The post package repair circuit 10 may include a fuse control circuit (fuse controller) 13. The fuse control circuit 13 may receive an address for memory access and control signals including a PPR control signal and an SPPR control signal. An active state of the PPR control signal is indicative of the semiconductor memory device 1 in a PPR mode to execute a hard PPR operation and an active state of the SPPR control signal is indicative of the semiconductor memory device 1 in an SPPR mode to execute a soft PPR (SPPR) operation.

The post package repair circuit 10 may include a pump circuit 14. For example, the pump circuit 14 may be a voltage generation circuit. In the PPR mode, the fuse control circuit 13 may provide a pump enable signal pumpEN that is in an active state to the pump circuit 14 responsive to the active state of the PPR control signal. Responsive to the active pump enable signal pumpEN, the pump circuit 14 may provide a write voltage (e.g., an antifuse breaking signal CGND). The post package repair circuit 10 may include antifuses (AFs) 15 that are in an initial state (e.g., nonconductive) and the pump circuit 14 may be coupled to the antifuses (AFs) 15. The fuse control circuit 13 may provide a repair address to be used in the PPR operation to the antifuses (AFs) 15. For example, the antifuse breaking signal CGND may be provided to blow an antifuse of the antifuses 15 that corresponds to the repair address corresponding to a defective group of memory cells. Thus, the antifuse 15 corresponding to the repair address may be in an active state (e.g., permanently conductive). The post package repair circuit 10 may include antifuse latch circuits 16. For example, the antifuse breaking signal CGND corresponding to the repair address may be permanently coupled to the antifuse latch circuits 16, thus the repair address may be provided to the antifuse latch circuits 16. For example, the antifuse latch circuits 16 may be programmable elements that store the repair address.

For example, an access address to be accessed may be provided along with an "Activate" command. The post package repair circuit 10 may include comparators 17. The comparators may check if the access address matches the repair address stored in the antifuse latch circuits 16 by comparing the access address and the repair address. If the access address matches the repair address, the comparators 17 may provide a hit signal. The decoder 12 may be a row decoder, for example, can cause a selected row of memory cells to be activated to access data associated with the access address. The decoder 12 may remap the access address of the defective group of memory cells to another group of memory cells (e.g., a group of "redundant" memory cells) that is functional in the redundant groups of memory cells, responsive to the hit signal. Thus, the selected row can be a row of redundant memory cells when the access address matches the repair address stored by the programmable elements.

In the SPPR mode, the fuse control circuit 13 may provide the pump enable signal pumpEN that is in an inactive state to disable the pump circuit 14 responsive to an active state of the SPPR control signal. Thus, the fuse control circuit 13 may disable storing the repair address into the antifuses (AFs) 15. The fuse control circuit 13 may provide a repair address to be used in the SPPR operation to the antifuse latch circuits 16. Thus, the repair address can be stored in the antifuse latch circuits 16. For example, the repair address may correspond to a group of memory cells that were identified as defective post packaging. In some cases, the group of memory cells identified as defective post packaging could be a group of redundant memory cells to which an address has been previously remapped. In such cases, another repair address can already be stored in programmable elements, such as antifuses, so that memory cells associated with the other repair address are not accessed. The repair address may be stored as part of a power-up sequence of the semiconductor memory device 1, for example. The repair address may be stored in the antifuse latch circuits 16 until the semiconductor memory device 1 is powered down. A storage element comprising volatile memory, such as latches, registers, and/or flip-flops, may be used as the antifuse latch circuits 16 to store the repair address. Similar to the PPR mode, the comparators 17 may check if the access address matches the repair address, If the access address matches the repair address, the comparators 17 may provide the hit signal and the decoder 12 may map the repair address to another group of memory cells. For example, the other group of memory cells can be a group of redundant memory cells (e.g., a column or row of redundant memory cells). The group of redundant memory cells do not have to be dedicated to soft post package repair. For instance, the repair address may be repeatedly mapped to the other group of memory cells.

Figure 2:
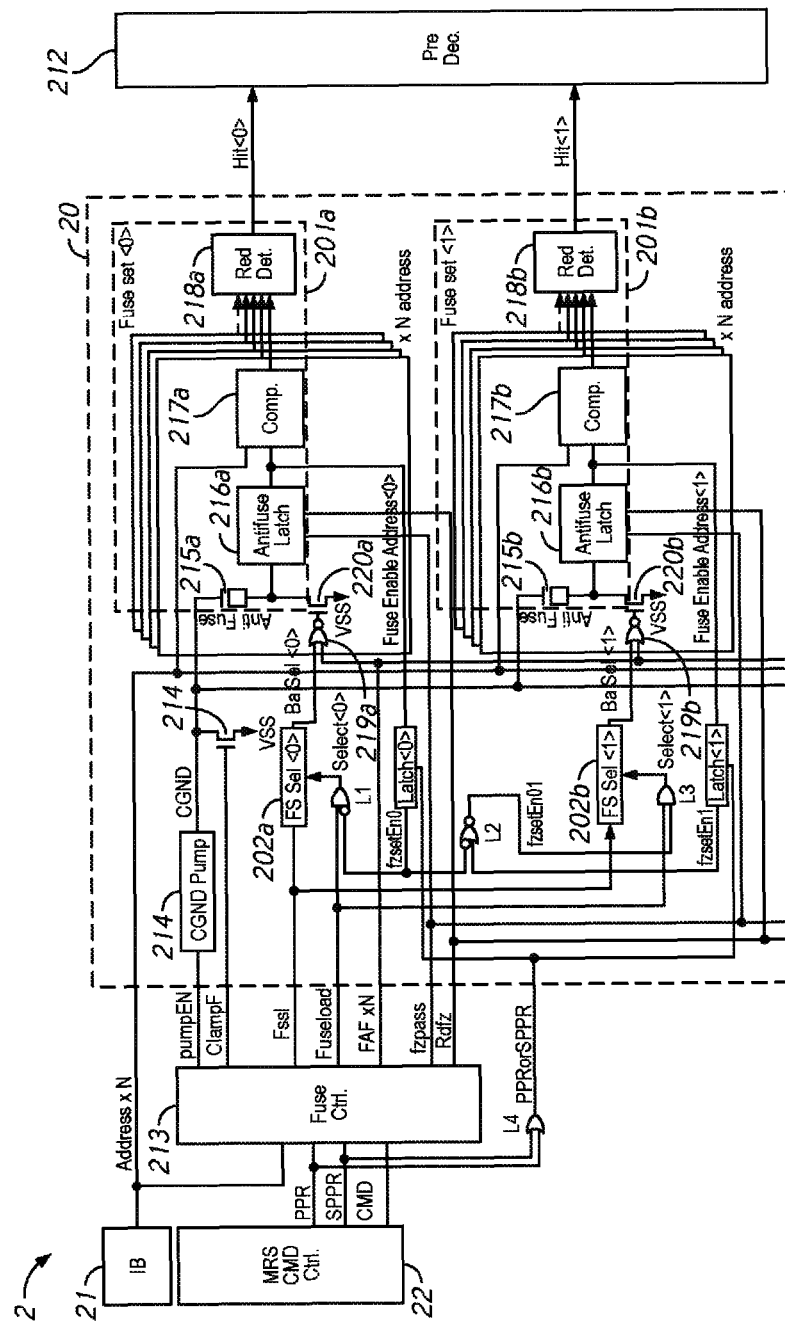
FIG. 2 is a block diagram of a semiconductor memory device including a post package repair circuit in accordance with an embodiment of the present disclosure.

FIG. 2 is a block diagram of a semiconductor memory device 2 including a post package repair circuit 20 in accordance with an embodiment of the present disclosure. For example, the post package repair circuit 20 may include two fuse sets <0> 201a and <1> 201b. For example, the post package repair circuit 20 may be able to perform an SPPR operation for a bank using an unused fuse set of the two fuse sets <0> 201a and <1> 201b after a PPR operation is executed on the bank and thus one of the two fuse sets <0> 201a and <1> 201b has been used for the PPR operation.

For example, the semiconductor memory device 2 may include an input buffer (IB) 21 that may receive a number of N addresses and may provide the number of N addresses, where N is a natural number. For example, N may be a number of banks. The semiconductor memory device 2 may include a mode register/command control circuit 22 that may receive a command, determine whether the command is related to a PPR mode or an SPPR mode, and store the mode in a mode register in the mode register/command control circuit 22. Alternatively, an "Activate" command or other command in the PPR mode or the SPPR mode may trigger either a PPR operation or an SPPR operation. The mode register/command control circuit 22 may provide a command signal CMD, a PPR control signal indicative of the semiconductor memory device 2 in the PPR mode to execute the hard PPR operation and an SPPR control signal indicative of the semiconductor memory device 2 in the SPPR mode to execute the SPPR operation to a fuse control circuit 213. The PPR control signal and the SPPR control signal may be provided to a logic circuit L4 that may provide a PPR or SPPR signal indicative of the semiconductor memory device 2 in either the PPR mode or the SPPR mode.

The post package repair circuit 20 may include a fuse control circuit 213 and a pump circuit 214. In the PPR mode, the fuse control circuit 213 may provide a pump enable signal pumpEN that is in an active state (e.g., a logic high level) to the pump circuit 214 and a clampF signal to a switch transistor 214' that is in an inactive state (e.g., a logic low level), responsive to the active state of the PPR control signal. The pump circuit 214 may be a voltage generation circuit coupled to antifuses 215a and 215b. The pump circuit 214 may provide a write voltage (e.g., an antifuse breaking signal CGND in an active state) to the antifuses 215a and 215b in the fuse sets <0> 201a and <1> 201b, respectively, responsive to the active pump enable signal pumpEN. For example, the antifuses 215a and 215b may be non-volatile storage elements that store information. In the SPPR mode, the fuse control circuit 213 may provide the pump enable signal pumpEN that is in an inactive state (e.g., a logic low level) to the pump circuit 214 and the clampF signal that is in an active state (e.g., a logic high level), responsive to the active state of the SPPR control signal. The clampF signal in the active state may be provided to a transistor 215' that may couple an output node of the pump circuit 215 to a voltage VSS (e.g., a ground level, a negative potential, etc.), thus the CGND signal may be clamped to an inactive state (e.g., a logic low level) that may be provided to the antifuses 215a and 215b.

The fuse control circuit 213 may provide a fuse set selection signal Fssl to fuse selectors, FS Sel<0> 202a and FS Sel<1> 202b. The fuse control circuit 213 may provide a fuseload signal in response to the PPR control signal or the SPPR control signal. The fuse selectors, FS Sel<0> 202a and FS Sel<1> 202b may provide bank selection signals BaSel<0> and BaSel<1> responsive to the fuse set selection signal Fssl further responsive to selection signals Select <0> and Select <1>, respectively, to select either the fuse set <0> 201a or the fuse set <1> 201b. For example, the bank selection signals BaSel<0> or BaSel<1> may be in an inactive state (e.g., a logic low level) if the corresponding fuse set <0> 201a or the corresponding fuse set <1> 201b may be selected, respectively. As described earlier, the antifuse breaking signal CGND may be provided to one end of the antifuse 215a and the antifuse 215b. An input address signal FAF, which is an inverted address of an external address, and either the bank selection signals BaSel<0> or BaSel<1> may be provided to a logic circuit 219a or a logic circuit 219b to activate a transistor 220a or a transistor 220b to couple the other end of the antifuse 215a and the antifuse 215b if either the fuse set <0> 201a or the fuse set <1> 201b is selected. Thus, the antifuse breaking signal CGND may be coupled to an antifuse latch circuit 216a or an antifuse latch circuit 216b. The antifuse latch circuits 216a and 216b may be a storage latch circuit that may store latch information. For example, the latch information may be repair address information, voltage adjustment information, etc. The details of the antifuse latch circuits 216a and 216b may be provided below along with FIG. 3A. Redundancy detector (Red. Det.) 218a and 218b may be provided for corresponding fuse sets <0> and <1>. For example, the redundancy detector 218a may activate Hit<0> signal when all signals from comparators 217a coupled to the redundancy detector 218a are in an active state when N bit Address signals from the input buffer (IB) 21 matches the stored address information in the antifuse latch circuit 216a. Similarly, the redundancy detector 218b may activate Hit<1> signal when all signals from comparators 217b coupled to the redundancy detector 218b are in an active state when N bit Address signals from the input buffer (IB) 21 matches the stored address information in the antifuse latch circuit 216b. Responsive to any Hit<x> signal (where x is either zero or one) from the redundancy detectors 218a and 218b, a pre decoder (Pre Dec.) 212 may switch an address access path (not shown) from an original address path to a redundant address path. For example, the original address path may be provided for accessing memory cells identified by the input address information and the redundant address path may be provided for accessing redundant memory cells. As understood, the address access path maintains the original address path in absence of any active Hit<x> signal.

FIG. 3A is a circuit diagram of an antifuse latch circuit 3 in accordance with an embodiment of the present disclosure. For example, the antifuse latch circuit 3 may be an antifuse latch circuit 216a or an antifuse latch circuit 216b in the post package repair circuit 20. A logic circuit 319 may be the logic circuit 219a or the logic circuit 219b in FIG. 2. An antifuse 315 may be an antifuse 215a or an antifuse 215b in FIG. 2. The antifuse latch circuit 3 may include a transfer transistor 31. The antifuse latch circuit 3 may be selectively switched responsive to a PPR mode or a SPPR mode, as the antifuse latch circuit 3 may be used in a PPR operation as described above or an SPPR operation. FIG. 3B is a timing diagram of signals in the antifuse latch circuit in a PPR operation in accordance with an embodiment of the present disclosure. In the PPR mode, a gate signal fzpass may be provided from a fuse control circuit, such as the fuse control circuit 213 in FIG. 2. The gate signal fzpass may be set to an inactive state (e.g., a logic low state) to protect the antifuse latch circuit 3 by insulating the antifuse latch circuit 3 from the antifuse 315 while the antifuse 315 is blown by an active state of the antifuse breaking signal CGND. The gate signal fzpass may be set to in an active state (e.g., a logic high level) when the antifuse 315 is completely blown and the antifuse breaking signal CGND is set to an inactive state. A repair address may be stored by discharging an fznode node in the antifuse latch circuit 3 by the inactive antifuse breaking signal CGND (e.g., a logic low level, VSS). If the antifuse 315 is not blown, the antifuse latch circuit 3 coupled to the antifuse 315 may correspond to an active state (e.g., a logic high level) of the input address signal FAF and may store the active state in advance following a power-up operation or a reset operation by precharging the fznode node to an active state (e.g., a logic high level) responsive to an inactive state (e.g., a logic low level) of an antifuse latch control signal RdFz from the fuse control circuit. Accordingly, the repair address provided by the input signal FAF in the PPR operation corresponding to one fuse set (1 bit) may be stored in the antifuse latch circuit 3.

FIG. 3C is a timing diagram of signals in the antifuse latch circuit in the SPPR operation in accordance with an embodiment of the present disclosure. In the SPPR operation, the antifuse breaking signal CGND is set to the inactive state (e.g., a logic low level). Instead, the repair address may be stored into the antifuse latch circuit 3 when the input address signal FAF may be provided while the gate signal fzpass in the active state is being provided by the fuse control circuit. Thus, the transfer transistor 31 may couple the logic circuit 319 via a transistor 320 to the fznode node. The antifuse latch circuit 3 may store the active state as an initial state after the power-up operation or the reset operation, similarly to the PPR operation, responsive to the active state (e.g., a logic high level) of the input address signal FAF, while the antifuse latch circuit 3 may store the inactive state (e.g., a logic low level) responsive to the inactive state (e.g., a logic low level) of the input address signal FAF. The repair address stored may be stored in to the antifuse latch circuit 3 until the antifuse latch circuit control signal RdFz is set to the inactive state at a power-down operation or a reset operation.

Figure 4:
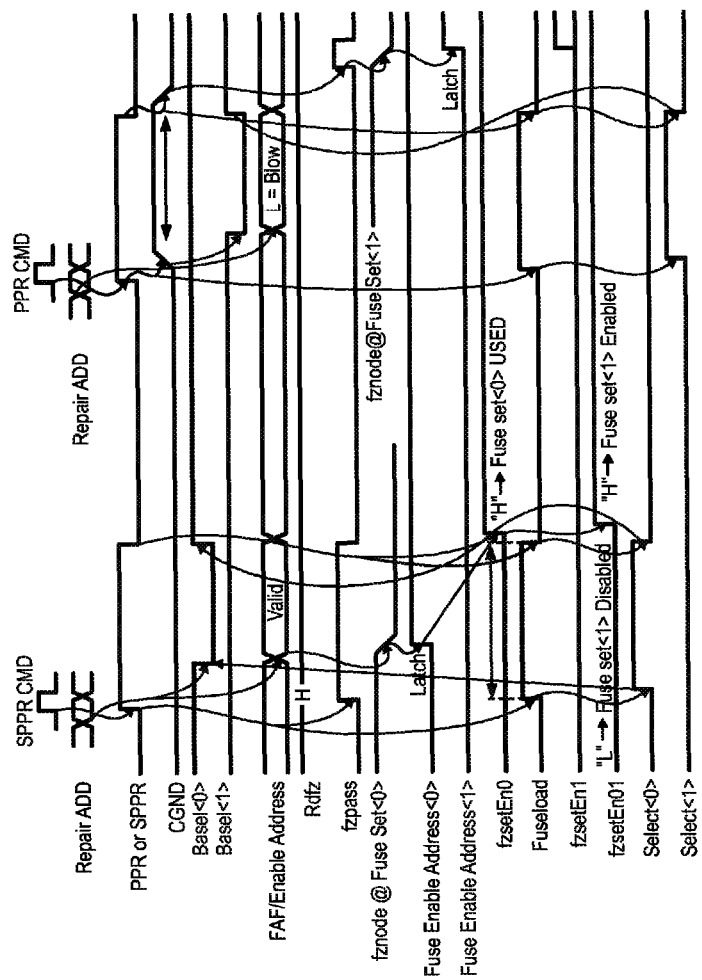
FIG. 4 is a timing diagram of signals in the post package repair circuit in accordance with an embodiment of the present disclosure.

FIG. 4 is a timing diagram of signals in the post package repair circuit 20 in accordance with an embodiment of the present disclosure. As earlier described with reference to FIG. 2, the post package repair circuit 20 may include two fuse sets 201a and 201b for a PPR operation and a SPPR operation to repair one row per one bank. In the timing diagram of FIG. 4, for example, the fuse set <0> 201a may be assigned to the SPPR operation responsive to an SPPR command and the fuse set <1> may be assigned to the PPR operation responsive to a PPR command when the PPR command is provided after the SPPR command without either a power-down operation or a reset operation between the SPPR command and the PPR command.

Either the fuse set <0> 201a or the fuse set <1> 201b may be selected by a latch <0> or a latch <1>. As described with reference to the antifuse latch circuit 3, the antifuse latch circuits 216a or the antifuse latch circuit 216b may store the repair address and provide the repair address as Fuse Enable Address <0> or Fuse Enable Address <1> to the comparator 217a and a latch <0> or the comparator 217b and a latch <1>, respectively. For example, Fuse Enable Address <0> and Fuse Enable Address <1> may represent usage statuses (e.g., available/already in use) of the fuse set <0> 201a and the fuse set <1> 201b, respectively. For example, the fuse set <0> may be given a higher priority to be used than the fuse set <1>. The fuse set <0> may be selected if the fuse set <0> is available. The fuse set <1> may be selected if the fuse set <0> is already used.

For example, initial states of the Fuse Enable Address <0>, <1> may be set to an inactive state (e.g., a logic low level) to indicate that neither the fuse set <0> 201a nor the fuse set <1> 201b may be used for either the PPR operation or the SPPR operation in an initial stage after the power-up operation or the reset operation. The PPR or SPPR signal may set to an active state (e.g., a logic high level) during the SPPR operation and during the PPR operation, responsive to the SPPR command and the PPR command following the SPPR command, for example. In an initial state, the fuse set <0> 201a and the fuse set <1> 201b are not used, and the latch <0> and the latch <1> may latch Fuse Enable Address <0> and Fuse Enable Address <1> in the inactive state (e.g., the logic low level), responsive to the PPR or SPPR signal, and may further provide the Fuse Enable Address <0> and Fuse Enable Address <I> signals as an fzsetEn0 signal and an fzsetEn1 signal respectively. Thus, the fzsetEn0 signal may be provided to logic circuits L1 and L2 and the fxsetEn1 signal may be provided to the logic circuit L2.

In the SPPR mode, the fuseload signal may be set to an active state (e.g., the logic high level) while the PPR or SPPR signal is set to the active state during the SPPR operation, and the fuseload signal may be provided to the logic circuit L1. The fuseload signal may also be provided during the PPR operation. Thus, the logic circuit L1 may receive the fzsetEn0 signal and the fuseload signal, and the logic circuit L1 may provide the selection signal Select <0> to the fuse selector FS Sel <0> 202a. For example, the logic circuit L1 may provide the selection signal Select <0> that is set to an active state (e.g., the logic high level) to select the fuse set <0> 201a may transition to a standby state while the fuse set <0> 201a may wait for the input address signal FAF. The logic circuit L2 may receive the fzsetEn0 signal and the fzsetEn1 signal and may further provide an fzsetEn01 signal in an inactive state (e.g., a logic low level) indicative of the fuse set <1> 201b being disabled. A logic circuit L3 may receive the fzsetEn00 signal and the fuseload signal and may provide the selection signal Select <1>. The fuse set <1> 201b may be disabled while the selection signal Select <1> is in an inactive state (e.g., a logic low level) based on the fzsetEn01 signal in the inactive state, whereas the fuse set <1> 201b may be selected (e.g., enabled) while the selection signal Select <1> is in an active state (e.g., a logic high level) based on the fzsetEn01 signal in an active state (e.g., a logic high level). As mentioned earlier, a usage state (e.g., an enable address) in the Fuse Enable Address <0> may be set to the active state in the SPPR operation responsive to the input address signal FAF in the inactive state when the fuse set <0> 201a is selected and the latch <0> that receives the Fuse Enable Address <0> may be disabled for latching the Fuse Enable Address <0> in transition until completing the SPPR operation to disable the fuse set <1> 201b. Thus, the fuse set <0> 201 is selected during the SPPR operation and the fuse set <0> 201a may store repair address information until the power-down operation or the reset operation and the repair address information may be lost (e.g., erased, initialized in a power-up sequence, etc.) after the power-down operation or the reset operation.

In the PPR mode following the SPPR mode, the PPR or SPPR signal and the fuseload signal may be set to the active state during the PPR operation, responsive to the PPR command. The Fuse Enable Address <0> and the Fuse Enable Address <1> may be latched at the latch <0> and the latch <1> responsive to the PPR or SPPR signal. As the fuse set <0> 201a is already in use, the Fuse Enable Address <0> may have been already set to the active state (e.g., the logic high level), and the latch <0> may provide the fzsetEn0 signal in an active state (e.g., the logic high level). The logic circuit L1 may provide the selection signal Select <0> that is set to an inactive state (e.g., a logic low level) responsive to the active fzsetEn0 signal, thus the fuse set <0> 201a may be disabled, accordingly. Simultaneously, the latch <1> may provide the fzsetEn1 signal in an inactive state (e.g., a logic low level), responsive to the Fuse Enable Address <1> in the inactive state (e.g., the logic low level) indicative of the fuse set <1> 201b being available. The logic circuit L2 may provide the fzsetEn0 signal in an active state responsive to the active fzsetEn0 signal and the inactive fzsetEn1 signal. The logic circuit L3 may provide the selection signal Select <1> that is set to an active state responsive to the active fzsetEn01 signal and the active fuseload signal. Thus, the fuse set <1> 201b may be selected, and the fuse set <1> 201b may store repair address information. After completing the PPR operation with the fuse set <1>, no more repair operation may be performed responsive to following PPR or SPPR command, because the fuse set <0> is already in use for the SPPR operation and the Fuse set <1> is already in use for the PPR operation, and the fzsetEn0 signal and the fzsetEn1 signal are in the active state (e.g., the logic high level). As described earlier, the repair address information stored in the fuse set <0> in the SPPR operation may be lost after the power-down operation or the reset operation. If the same repair address information may be stored with the PPR command instead, the repair address information may be stored after the power-up operation or the reset operation. For example, repair address information may be stored in a fuse set with the SPPR operation once and once it is successful, then the same repair address information may be stored with the PPR operation in the same fuse set after the power-up operation or the reset operation.

Figure 5A:
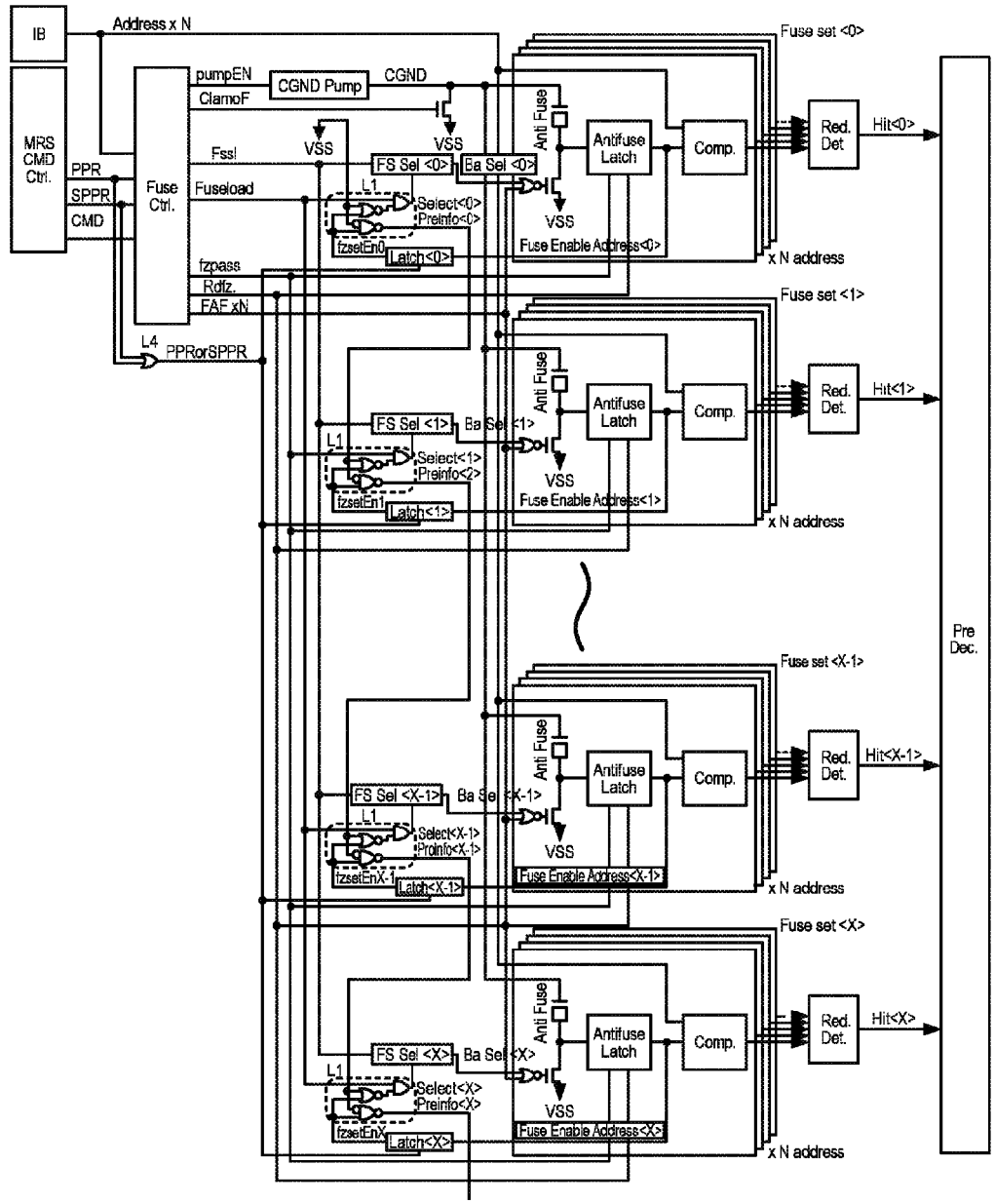
FIG. 5A is a block diagram of the semiconductor memory device including the post package repair circuit in accordance with an embodiment of the present disclosure.

In one embodiment, two fuse sets per bank may be provided for sharing between the SPPR operation and the PPR operation. In another embodiment, all fuse sets may be used with antifuse latches for sharing between the SPPR operation and the PPR operation. FIG. 5 is a block diagram of the semiconductor memory device including the post package repair circuit in accordance with an embodiment of the present disclosure. For example, each bank may be provided with a number of fuse sets <0:X>, wherein the number may be (X+1) that is an integer greater than two. Description of components corresponding to components included in FIG. 2 will not be repeated and changes from FIG. 2 including control circuits and logic circuits will be described. For example, a logic circuit L1 for each fuse set <k>, (wherein "k" is an integer between 0 and X+1) may receive an fzsetEnk signal from latch <k> and may provide an selection signal Select <k> and PreInfo<k> signal. The fuse set <k> may be selected if the selection signal Select <k> may be in an active state. The PreInfo <k> signal may function similarly to the fzsetEn01 signal in FIGS. 2 and 4 indicative of usage information of fuse set <k> to a logic circuit L for fuse set <k+1>. For example, the fzsetEnk signal may be in an active state (e.g., a logic high level) when the fuse set <k> is already in use, and the selection signal Select <k> is set to an inactive state (e.g., a logic low level) and the fuse set <k> is disabled for a future use. The logic circuit L1 for the fuse set <k> may provide the PreInfo <k> signal in an inactive state (e.g., a logic low level) to the logic circuit L1 for fuse set <k+1> that is coupled between a latch <k+1> and a fuse selector FS Sel <k+1>. FIG. 5B is a table of a selection status of the fuse set <k+1> responsive to a combination of the Preinfo <k> signal and the fzsetEn (k+1) signal, in accordance with an embodiment of the present disclosure. For example, the fuse set <k+1> may be selected responsive to a combination of the Preinfo <k> signal in the inactive state (e.g., the logic low level "L") indicative of the fuse set <k> being already in use and the fzsetEn(k+1) signal in an inactive state (e.g., "L") indicative of availability of the fuse set <k+1>. Similarly, the fuse set <k+1> may be unselected if the PreInfo<k> signal is indicative of availability of the fuse set <k> and/or if the fzsetEn (k+1) signal is indicative of the fuse set <k+1> already in use. For example, the fuse sets may be used with priority from the fuse set <0> to the fuse set X and an available fuse set next to a used fuse set(s) may be used. As described earlier, repair address information stored in the fuse set <k> in the SPPR operation may be lost after the power-down operation or the reset operation. If the same repair address information may be stored with the PPR command instead, the repair address information may be stored after the power-up operation or the reset operation.

Figure 6:
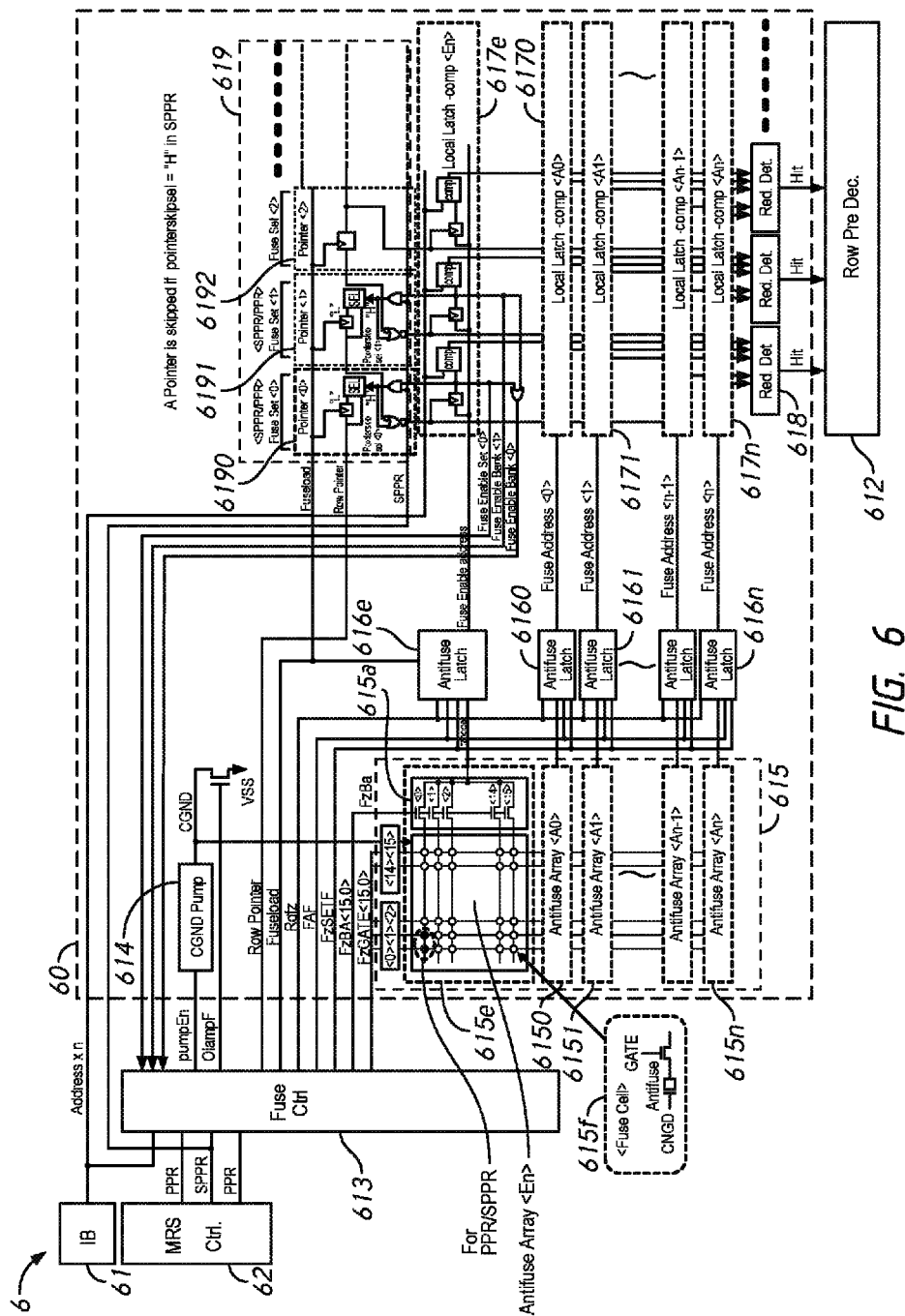
FIG. 6 is a block diagram of a semiconductor memory device including a post package repair circuit with an antifuse array circuit in accordance with an embodiment of the present disclosure.

FIG. 6 is a block diagram of a semiconductor memory device 6 including a post package repair circuit 60 with an antifuse array circuit 615 in accordance with an embodiment of the present disclosure. Description of an input buffer 61 and a mode register/command control circuit 62 corresponding to the input buffer 21 and the mode register/command control circuit 22 included in FIG. 2 will not be repeated. The antifuse array circuit 615 may include an antifuse array <En> 615e that includes fuse cells 615f. For example, a number of fuse cells 615f may be 16×16, where each fuse cell may be indicated as fuse cell[k, l] (where k and l are integers equal to or less than 16). For example, each fuse cell may be used for a PPR operation or an SPPR operation. Each fuse cell [k, l]615f may include an antifuse that may receive an antifuse breaking signal CGND and a transistor that may receive a gate signal FzGATE<1> among gate signals FzGATE<15:0> that may be provided from a fuse control circuit 613. Thus, all antifuses for fuse enable sets may be included in the antifuse array <En> 615e, while all antifuses for each fuse set <m> (where m is an integer equal to or less than n, where "n+1" is a number of fuse sets) may be included in each antifuse array <m>. Thus, the antifuse arrays 615 may include the antifuse array <En> 615e and antifuse arrays <A0:An> 6150-615n. In order to select an antifuse for a fuse set, a fuse cell 615f in an antifuse array <En> 615e may be selected responsive to the FzGATE signals and the antifuse breaking signal CGND in an active state (e.g., a logic high level) to the antifuse array <En> 615e. The fuse cell 615f may store information that may be provided to an antifuse latch 616e by blowing an antifuse in the fuse cell 615f, responsive to the corresponding FzGATE signal and the antifuse breaking signal CGND. A plurality of switches 615a may be responsive to corresponding FzBA signals that may be provided from the fuse control circuit 613 to couple the blown antifuse in the fuse cell 615f, and the antifuse latch 616e may provide latched information to a local latch comparator (latch-comp)<En> 617e responsive to the fuseload signal. The mode register/command control circuit 62 may provide a command signal CMD, a PPR control signal indicative of the semiconductor memory device 6 in the PPR mode to execute the hard PPR operation and an SPPR control signal indicative of the semiconductor memory device 6 in the SPPR mode to execute the SPPR operation to a fuse control circuit 613.

In a PPR operation, a fuse cell assigned for the PPR operation and corresponding to a fuse set not already in use may be selected. For example, signals such as Fuse Enable set <0> and Fuse Enable set <1> may represent usage statuses (e.g., available/already in use) of the fuse set <0> and the fuse set <1> in fuse sets, respectively. If the Fuse Enable Set <0> is in an active state (e.g., a logic high level), the Fuse Enable Set <0> is indicative that the fuse set <0> is already in use. For example, each bank may include two fuse sets for PPR/SPPR operations in the post package repair circuit 60 of FIG. 6. For example, each bank may also include a Fuse Enable Bank <x> signal for each bank <x> (where x is an integer less than a number of banks). The Fuse Enable Bank <x> signal may be obtained by an OR operation of the Fuse Enable Set <0> signal and the Fuse Enable Set <1>. Thus, the Fuse Enable Bank <x> signal may be indicative of whether any fuse set is used for the bank <x>. The Fuse Enable Bank <x> signal may be provided to the fuse control circuit 613. The fuse control circuit 613 may select a fuse cell corresponding a fuse set not already in use and available by the FzGate and FzBA signals. Similarly, in an SPPR operation, a fuse cell corresponding to a first fuse set available may be selected by the FzGate and FzBA signals. Responsive to the selection of the first fuse set, repair address information may be transferred from the antifuse latch 616e to a local latch-comparator <En> 617e, responsive to the fuseload signal.

A pointer circuit 619 may include a number of pointers including Pointer <0> 6190, Pointer <1> 6191, and Pointer <2> 6192, corresponding to the number of fuse sets, fuse set <0>, fuse set <1>, and fuse set <2>, respectively. The pointer circuit 619 may receive the fuseload signal, a row pointer signal and an SPPR signal indicative of the semiconductor memory device 6 in the SPPR mode. In the PPR operation, each of the number of pointers may provide an EnFuseload <a> signal, where "a" is a natural number equal to or less than (n+1). The EnFuseload <a> signal may be provided sequentially by shifting the row pointer signal in a predetermined direction (e.g., from Pointer <a> to Pointer <a+1>) responsive to the fuseload signal. In the SPPR operation, the pointer function may be disabled responsive to the SPPR signal in an active state. Target data sets may be transferred in a short data transfer period, typically defined in a specification of the semiconductor memory device 6, and local latch-comparators already in use may be skipped and data already stored in the local latch-comparators may be protected. The pointer circuit 619 may skip activation of the EnFuseload <a> signal if the corresponding Fuse Enable set <a> signal is indicative of an "already in use" state in the SPPR operation. For example, each pointer used for SPPR and PPR operations, such as Pointer <0> 6190 and Pointer <1> 6191 may include a latch, a selector SEL, and logic circuits, such as an NOR circuit and an AND circuit. Pointers, including Pointer <a> (where "a" greater than 1) is for normal operations and each Pointer <a> may include a latch that may provide the EnFuseload<a> responsive to the fuseload signal and an output signal of Pointer <a-1>.

FIG. 7A is a circuit diagram of an antifuse latch circuit 7 in accordance with an embodiment of the present disclosure. For example, the antifuse latch circuit 7 may be the antifuse latch 616e in the post package repair circuit 60. Because the antifuses 615a in FIG. 6 may include a transistor in each antifuse<1>, the transistor in each antifuse<1> may receive the FzBA<1> signal at a gate thereof, and provide an fznode<1> signal responsive to the FzBA<1> signal. Thus, a transistor such as the transistor 320 in FIG. 3A may not be included in the antifuse latch circuit 7. The antifuse latch circuit 7 may include a fuse load circuit 71 and an antifuse latch 73. The antifuse latch circuit 7 may be selectively switched by the plurality of switches 615a responsive to a PPR mode or an SPPR mode, as the antifuse latch circuit 7 may be used in a PPR operation or an SPPR operation. FIG. 7B is a timing diagram of signals in the antifuse latch circuit in an SPPR operation in accordance with an embodiment of the present disclosure. In the SPPR mode, an antifuse in the fuse cell 615f is not blown, and a corresponding latch circuit 7 coupled to the antifuse in the fuse cell 615f may correspond to an active state (e.g., a logic high level) of the input address signal FAF and may store the active state in advance following a power-up operation or a reset operation, by precharging the fznode node to an active state (e.g., a logic high level) responsive to an inactive state (e.g., a logic low level, not shown in FIG. 7B) of an antifuse latch control signal RdFz from the fuse control circuit 613.

Upon a receipt of the SPPR command, an SPPR control signal in an active state may be provided from the mode register/command control circuit 62 to the fuse control circuit 613. The fuse control circuit 613 may set a pump enable signal PumpEn to an inactive state (e.g., a logic low level) and a ClampF signal to an active state (e.g., a logic high level) to set the antifuse breaking signal CGND to the inactive state (e.g., the logic low level). The fuse control circuit 613 may provide the input address signal FAF and a selection signal FzSETF in an inactive state (e.g., at a logic low level) to a logic circuit 719 in the antifuse latch circuit 7, responsive to the SPPR control signal. Thus, the input address signal FAF in an activate state may activate a transistor 720 to set the fznode node to a logic low level, which is indicative of the repair address in an active state (e.g., at a logic high level) and a corresponding fuse set may be used to store repair address information. Accordingly, the repair address provided by the input signal FAF in the SPPR operation corresponding to one fuse set (1 bit) may be stored in the antifuse latch circuit 7. The repair address stored may be stored in to the antifuse latch circuit 7 until the antifuse latch circuit control signal RdFz is set to the inactive state at the power-down operation or the reset operation.

Once the repair address information is latched, the latched repair address information as the Fuse Enable Address signal may be transferred from the antifuse latch circuit 7 to a corresponding local latch, such as a local latch-comparator 617 (e.g., one of local latch-comparators <A0-An> 6170-617n via a local latch-comparator 617e) closer to redundancy detectors 618 and a row pre decoder 612 in FIG. 6, responsive to the fuseload signal. Here, repair address information of one fuse set may be transmitted in the SPPR mode due to a limited transmission period, unlike in a PPR mode where repair address information of all row fuse sets can be transmitted by pointers. In order to identify local latch-comparators to receive the transmitted repair address information, the local latch-comparators of a fuse set assigned for PPR/SPPR operations may receive a Pointerskipsel<a> signal. For example, the Pointerskipsel<a> signal may be provided to control a selector SEL in each pointer<a> as an output signal of an AND circuit that receives the Fuse Enable set <a> signal and the SPPR control signal. For example, an initial state of the Fuse Enable set <0> signal is in an inactive state (e.g., a logic low level) while fuse set <0> is not in use and available. While the SPPR control signal is activated, the Pointerskipsel<0> signal may be maintained at the inactive state and Pointer <0> for the fuse set <0> may not be skipped. Thus, an EnFuseload<0> signal may be activated and the Fuse Enable Address signal may be latched by a local latch-comparator <En> 617e for the fuse set <0> until the power-down operation or the reset operation.

Figure 7C:
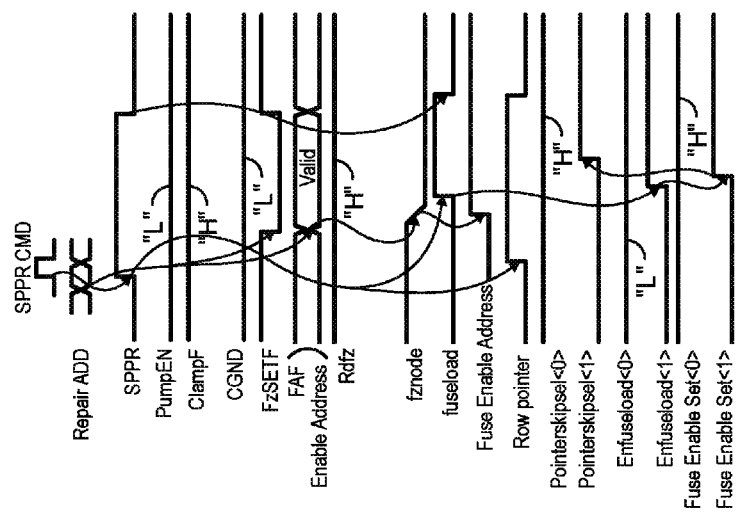
FIG. 7C is a timing diagram of signals in the post package repair circuit in accordance with an embodiment of the present disclosure.

FIG. 7C is a timing diagram of signals in the post package repair circuit in accordance with an embodiment of the present disclosure. A bit may be repaired using a fuse set <1> by the SPPR operation after repairing a bit using a fuse set <0> by the SPPR operation, wherein the bits are in the same bank. Here, the Fuse Enable set <0> signal may be set to an active state (e.g., at a logic high level) because the fuse set <0> is already in use. When the SPPR control signal is activated, responsive to a second SPPR command, the Pointerskipsel<0> signal may be in an active state (e.g., at a logic high level) and a row pointer signal may be forwarded by a selector SEL in the Pointer <0>. The EnFuseload <0> signal for the fuse set <0> may be set to an inactive state (e.g., a logic low level), and the Fuse Enable Address signal latched by the local-latch-comparator <En> 617e for the fuse set <0> may be protected, due to the inactive EnFuseload <0> signal. The fuse set <1> is not in use and available, and the Fuse Enable set <1> signal may be set to an inactive state (e.g., at a logic low level) and a Pointerskipsel<1> signal may be in an inactive state (e.g., at a logic low level). Accordingly, the local-latch-comparator <En> 617e for the fuse set <1> may be used and the EnFuseload <1> signal for the fuse set <1> may be set to an active state (e.g., at a logic high level). Thus, the local-latch-comparator <En> 617e for the fuse set <1> may store the Fuse Enable Address signal in an active state and the Fuse Enable set <1> may be set to an active state (e.g., at a logic high level) until the power-down operation or the reset operation in the SPPR operation.

Figure 8:
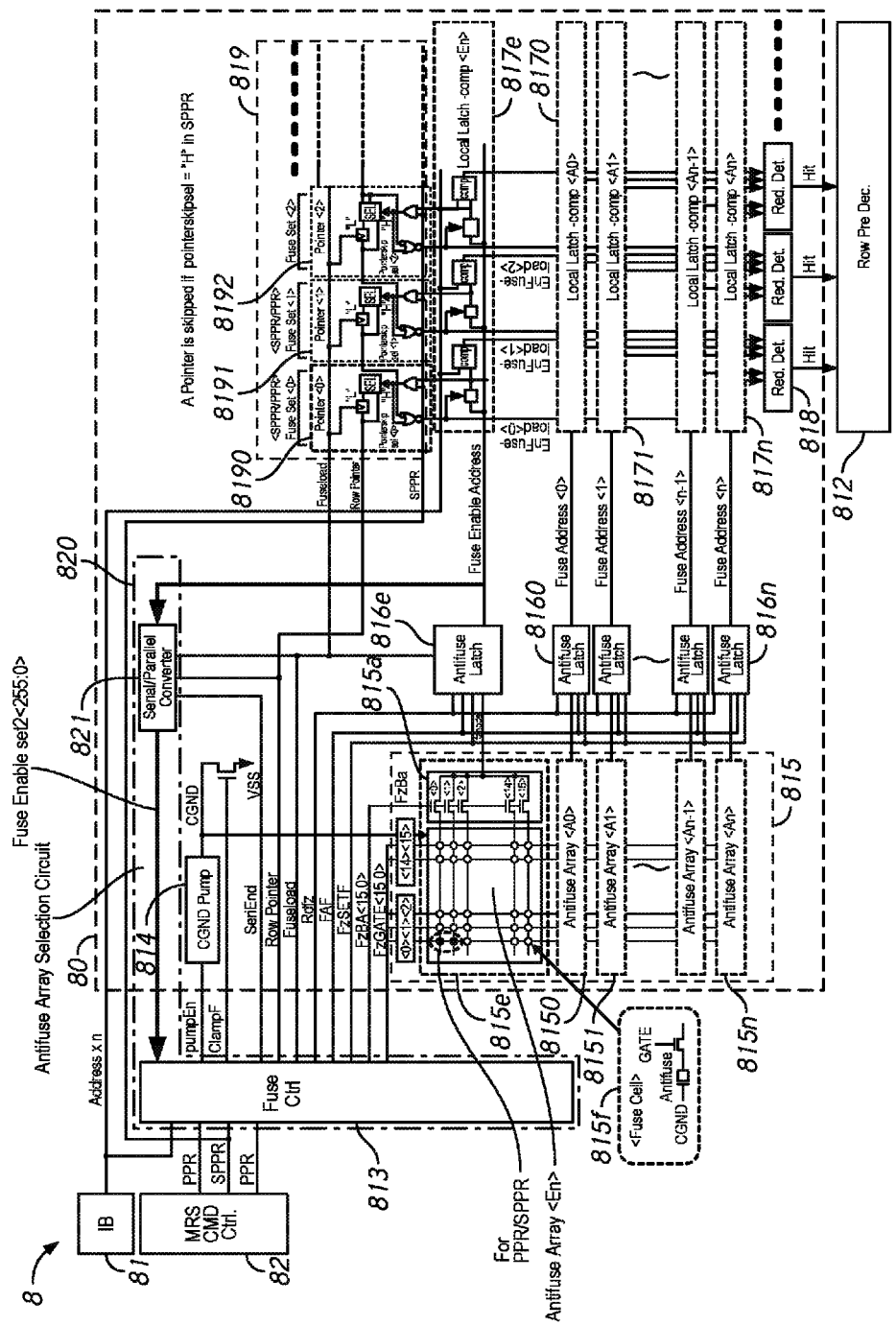
FIG. 8 is a block diagram of a semiconductor memory device including a post package repair circuit in accordance with an embodiment of the present disclosure.

FIG. 8 is a block diagram of a semiconductor memory device 8 including a post package repair circuit 80 in accordance with an embodiment of the present disclosure. Description of an input buffer 81 and a mode register/command control circuit 82 corresponding to the input buffer 21 and the mode register/command control circuit 22 included in FIG. 2 will not be repeated. A pointer circuit 819 may include a number of pointers including Pointer <0> 8190, Pointer <1> 8191, and Pointer <2> 8192, corresponding to the number of fuse sets, fuse set <0>, fuse set <1>, and fuse set <2>, respectively. All the fuse sets may be used for PPR/SPPR operations. The pointer circuit 819 may receive the fuseload signal, a row pointer signal and an SPPR signal indicative of the semiconductor memory device 8 in the SPPR mode. Description of the pointer circuit 819 corresponding to the pointer circuit 619 included in FIG. 6 will not be repeated. For example, each pointer used for SPPR and PPR operations, all pointers including Pointer <0> 8190, Pointer <1> 8191, Pointer <2> 8192, may include a flip-flop, a selector SEL, and logic circuits, such as an NOR circuit and an AND circuit.

Figure 9:
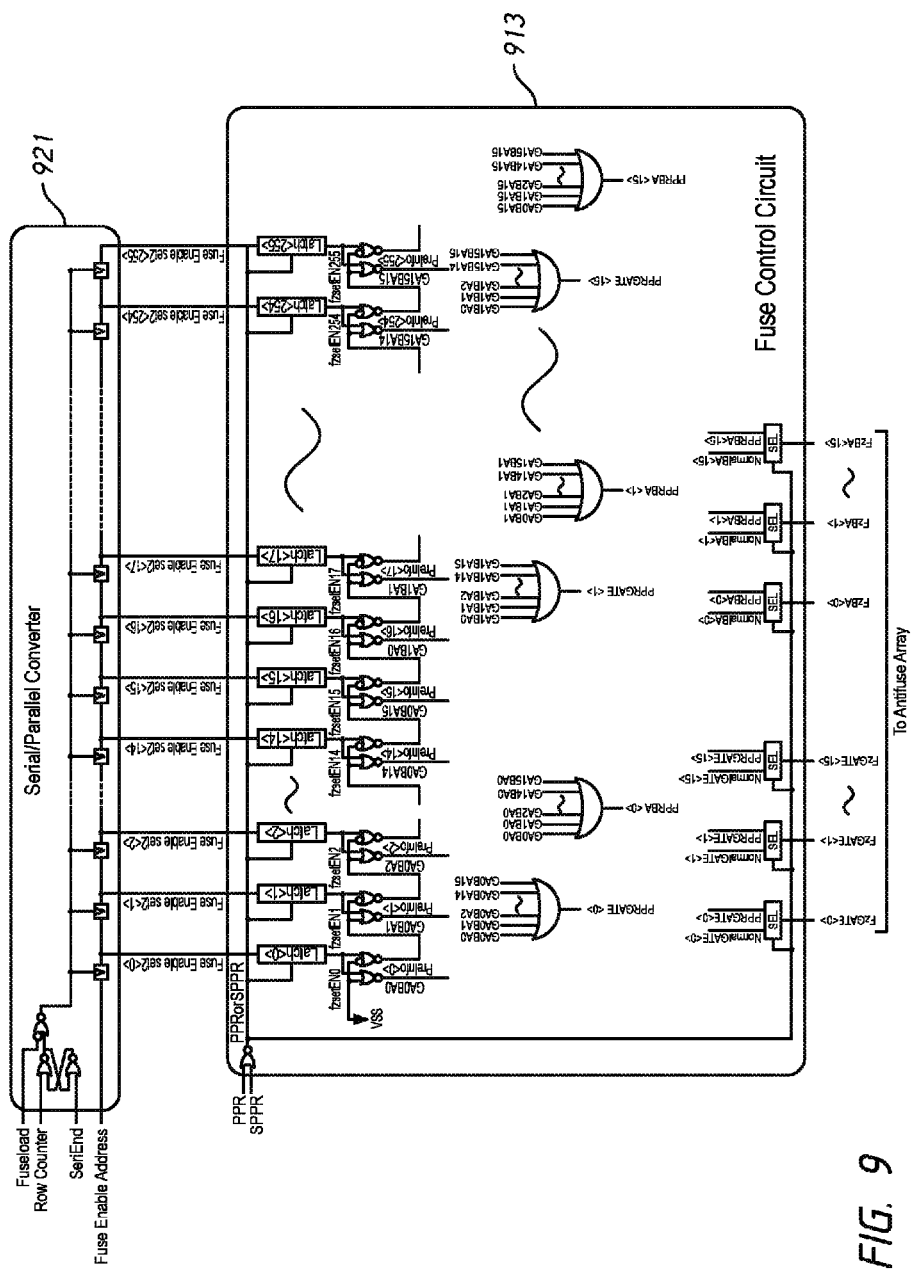
FIG. 9 is a schematic diagram of the serial/parallel converter and the fuse control circuit in the post package repair circuit of in FIG. 8, in accordance with an embodiment of the present disclosure.

In a PPR operation, a fuse cell assigned for the PPR operation and corresponding to a fuse set not already in use may be selected. For example, the post package repair circuit 80 may include an antifuse array selection circuit 820 that includes fuse control circuit 813 and a serial/parallel converter 821. Instead of providing Fuse Enable set signals in parallel that may represent usage statuses (e.g., available/ already in use) of a plurality of fuse sets (e.g., 256 fuse sets), an antifuse latch 816e may provide an Fuse Enable Address signal that may include usage statuses of the plurality of fuse sets to the serial/parallel converter 821 as well as to a local latch comparator (latch-comp)<En> 817e, responsive to the fuseload signal. The serial/parallel converter 821 may convert the Fuse Enable Address signal to provide Fuse Enable Set2 <255:0> signals, that may function as antifuse selection signals that may identify an antifuse in a fuse cell among fuse cells in the antifuse array circuit 815e. The serial/ parallel converter 821 may provide the Fuse Enable Set2 <255:0> signals to the fuse control circuit 813. The fuse control circuit 813 may select the fuse cell corresponding a fuse set not already in use and available by the FzGate and FzBA signals, responsive to the Fuse Enable Set2 <255:0> signals. Similarly, in an SPPR operation, a fuse cell corresponding to a first fuse set available may be selected by the FzGate and FzBA signals, responsive to the Fuse Enable Set2 <255:0> signals. Responsive to the selection of the first fuse set, repair address information may be transferred from the antifuse latch 816e to the local latch-comparator <En> 817e, responsive to the fuseload signal. FIG. 9 is a schematic diagram of a serial/parallel converter 921 and a fuse control circuit 913 in a post package repair circuit, in accordance with an embodiment of the present disclosure. For example the post package repair circuit may be the post package repair circuit 80 of FIG. 8 and the serial/parallel converter 921 and the fuse control circuit 913 may be the serial/ parallel converter 821 and the fuse control circuit 813 in FIG. 9. For example, the serial/parallel converter 921 may include a shift register including a plurality of flip flops that may correspond a plurality of fuse sets. For example, the serial/parallel converter 921 may convert a Fuse Enable Address signal from an antifuse latch (e.g., the antifuse latch 816e) to provide Fuse Enable Set2 <255:0> signals in an initializing operation included in a power-up operation or a reset operation. The shift register in the serial/parallel converter 921 may receive Fuse Enable Address signal in a serial manner and the plurality of flip flops in the shift register may store usage statuses (e.g., available/already in use) of the plurality of corresponding fuse sets and provide Fuse Enable Set2 <255:0> signals corresponding to the plurality of fuse sets responsive to the Fuse Enable Address signal in the initializing operation.

A fuse set not already in use and available may be automatically selected upon entering a PPR operation or an SPPR operation. Responsive to a PPR control signal and an SPPR control signal, PPR or SPPR signal indicative of being in either a PPR mode or an SPPR mode may be provided. For example, in FIG. 9, the serial/parallel converter 921 may provide the Fuse Enable Set2 <255:0> signals sequentially from the Fuse Enable Set2 <255> signal to the Fuse Enable Set2 <0> signal. Responsive to the PPR or SPPR signal, the plurality of latches <255:0> may latch the Fuse Enable Set2 <255:0> signals from the serial/parallel converter 921. Thus, an antifuse in an antifuse array may be selected by an activation order, such as activating FzGATE<15> signal first and sequentially activating from FzBA<15> signal to FzBA<0> signal while FzGATE<15> signal is in an active state, activating FzGATE<14> signal and activating FzBA<15> signal to FzBA<0> signal while the FzGATE<14> signal is in an active state, to recursively continue this sequence until FzBA<15> signal to FzBA<0> signal may be activated while FzGATE<0> signal is in an active state. Thus, in the PPR or SPPR operation, a fuse set next available may be selected based on a reverse order of the activation order, from fuse set <0> corresponding Fuse Enable set2 <0> signal, which may be associated by a fuse cell selected by a combination of active FzGATE<0> and FzBA<0> signals. If the fuse set <0> is not already in use and available when the PPR or SPPR signal is being activated, the latch <0> may provide fzsetEn0 signal in an inactive state (e.g., at a logic low level) based on the Fuse Enable Set2 <0> signal. The inactive fzsetEn0 signal may be provided to a NOR circuit and a NAND circuit. The NOR circuit may receive the inactive fzsetEn0 signal and a voltage VSS (e.g., at a logic low level) and may provide a gate and bank selection signal GA0BA0 in an active state (e.g., at a logic high level). The NAND circuit may receive the inactive fzsetEn0 signal and an inversed signal of the voltage VSS and may provide PreInfo<0:255> signals in an active state (e.g., at a logic high level). Gate and bank selection signals GAxBAy (where x is a gate id from 0 to 15 and y is a bank id from 0 to 15) other than the GA0BA0 signal may be set to an inactive state (e.g., a logic low level) responsive to the active PreInfo<0:254> signals. For each gate id x, GAxBAy signals may be provided to an OR circuit that may provide PPRGATE <x> signal. For each bank id y, GAxBAy signals may be provided to an OR circuit that may provide PPRBA <y> signal. Thus, the PPRGATE <0> and PPRBA<0> signals may be in an active state (e.g., at a logic high level) among the PPRGATE<15:0> and PPRBA<15:0> signals. For each gate id x, a selector may receive the PPRGATE<x> signal and NormalGATE<x> signal and may provide the PPRGATE<x> signal as FzGATE<x> signal responsive to the active PPR or SPPR signal or may provide the NormalGATE<x> signal as FzGATE<x> signal responsive to the inactive PPR or SPPR signal. For each bank id y, a selector may receive the PPRBA<y> signal and NormalBA<y> signal and may provide the PPRBA<y> signal as FzBA<y> signal responsive to the active PPR or SPPR signal or may provide the NormalBA<y> signal as FzBA<y> signal responsive to the inactive PPR or SPPR signal. Thus, active FzGATE<0> and FzBA<0> signals may be provided to select an antifuse in a fuse cell, such as an fuse cell 615f or 815f in an antifuse array circuit, such as an antifuse array <En> 615e or 815e. In a meantime, pointer-skipsel<0> signal may be set to an inactive state (e.g., a logic low level) while pointersipsel<1:255> may be set to an active state in FIG. 8, and a local latch for the fuse set <0> may store repair address information to be used in an normal row access operation.

If the fuse set <0> is already in use and fuse set <1> is not already in use and available when the PPR or SPPR signal is being activated, the Fuse Enable set2 <0> signal may be in an active state (e.g., at a logic high level) and the gate and bank selection signal GA0BA0 and the PreInfo<0> signal in an inactive state (e.g., a logic low level) may be provided. The Fuse Enable set2<1> signal may be in an inactive state indicative that the fuse set <1> is available and a gate and bank selection signal GA0BA1 may be set to an active state (e.g., at a logic high level) the PreInfo<0> signal may be set to an inactive state (e.g., a logic low level) while the PreInfo<1:255> signals may be set to the active state. Thus, in order to select an antifuse in a fuse cell, such as an fuse cell 615f or 815f in the antifuse array circuit associated with the fuse set <1>, the gate and bank selection signals GAx-BAy other than the GA0BA1 signal may be set to an inactive state (e.g., a logic low level) responsive to the active PreInfo<1:254> signals. Thus, active FzGATE<0> and FzBA<1> signals may be provided to select an antifuse in a fuse cell, such as an fuse cell 615f or 815f in an antifuse array circuit, such as an antifuse array <En> 615e or 815e. In a meantime, pointerskipsel<1> signal may be set to an inactive state (e.g., a logic low level) while pointersipsel<0, 2:255> may be set to an active state in FIG. 8, and a local latch for the fuse set <1> may store repair address information to be used in an normal row access operation.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a non-volatile storage element configured to store information;
a storage latch circuit coupled to the non-volatile storage element and configured to store latch information; and
a control circuit configured, in a first repair mode, to receive first repair address information and provide the first repair address information to the non-volatile storage element and further configured to transmit the first repair address information from the non-volatile storage element to the storage latch circuit,
wherein the control circuit is configured, in a second repair mode, to receive second repair address information and provide the second repair address information to the storage latch circuit, and further configured to disable storing the second address information into the non-volatile storage element.

2. The apparatus of claim 1, further comprising a voltage generation circuit coupled to the non-volatile storage element and configured to provide a write voltage to the non-volatile storage element when activated,
wherein the control circuit is configured to activate the voltage generation circuit in the first repair mode, and further configured to deactivate the voltage generation circuit in the second repair mode.

3. The apparatus of claim 1, wherein the non-volatile storage element includes an anti-fuse circuit.

4. The apparatus of claim 1, wherein the first repair mode is a post package repair mode and the second repair mode is a soft post package repair mode.

5. The apparatus of claim 1, further comprising a comparator circuit coupled to the storage latch circuit and configured to compare access address information and the latch repair address information from the storage latch circuit.

6. An apparatus comprising:
first and second sets of non-volatile storage elements;
a first set of storage latch circuits, each of the storage latch circuits of the first set of storage latch circuits being coupled respectively to the non-volatile storage elements of the first set of non-volatile storage elements;
a second set of storage latch circuits, each of the storage latch circuit of the second set of storage latch circuits being coupled respectively to the non-volatile storage elements of the second set of non-volatile storage elements; and
a control circuit configured to receive a first repair command along with first repair address information and store the first repair address information into the non-volatile storage elements of a selected one of the first and second sets of non-volatile storage elements responsive, at least in part, to the first repair command, and further configured to transfer the first repair address information from the selected one of the first and second sets of non-volatile storage elements to the storage latch circuits of a respective set of storage latch circuits, the control circuit further configured to receive a second repair command along with second repair address information and store the second repair address information into a selected one of the first and second sets of storage latch circuits in response, at least in part, to the second repair command.

7. The apparatus of claim 6, further comprising a voltage generation circuit coupled in common to the non-volatile storage elements of the first and second sets of non-volatile storage elements and configured to provide a write voltage to the non-volatile storage elements of the first and second sets of non-volatile storage elements when activated, and wherein the control circuit is further configured to activate the voltage generation circuit in response to the first repair command and not to activate the voltage generation circuit in response to the second repair command.

8. The apparatus of claim 6, wherein each of the first and second sets of non-volatile storage elements comprises an enable storage element configured to hold enable information that indicates a respective set of non-volatile storage elements are used or unused, and the control circuit is further configured to select the selected one of the first and second sets of non-volatile storage elements in response, at least in part, to the enable information provided from the enable storage elements of the first and second sets of non-volatile storage elements.

9. The apparatus of claim 6, wherein each of the first and second sets of non-volatile storage elements comprises an enable storage element configured to hold enable information that indicates a respective set of non-volatile storage elements are used or unused, and the control circuit is further configured to select the selected one of the first and second sets of storage latch circuits in response, at least in part, to the enable information provided from the enable storage elements of the first and second sets of non-volatile storage elements.

10. The apparatus of claim 9, wherein the control circuit comprises a first circuit configured to receive the enable information from the enable storage element of the first set of non-volatile storage elements and provide a pre-information signal that indicates the first set of non-volatile storage elements are used or unused, the control circuit further comprises a second circuit configured to receive the pre-information signal and the enable information from the enable storage element of the second set of non-volatile storage elements and select the second set of the storage latch circuits in response, at least in part, to the pre-information signal and the enable information from the enable storage element of the second set of non-volatile storage elements.

11. An apparatus comprising:
a fuse controller configured to provide repair address information;
a fuse set comprising a latch circuit configured to store the repair address information; and
an antifuse circuit coupled to the latch circuit, configured to receive and store repair address information from the fuse controller in a first repair mode, and further configured to provide the repair address information,
wherein the fuse controller is further configured to provide control signals to cause the antifuse circuit to store the repair address information, and
wherein the latch circuit is configured to receive the repair address information from the antifuse circuit in the first repair mode, and further configured to receive the repair address information from the fuse controller in a second repair mode.

12. The apparatus of claim 11, wherein the antifuse circuit is a non-volatile storage element, and wherein the repair address information stored in the latch circuit is erased by a power-down operation or the reset operation.

13. The apparatus of claim 12, wherein the latch circuit is configured to store first repair address information from the fuse controller in the second repair mode until the power-down operation or the reset operation, and
wherein the fuse controller is configured to provide the control signals to cause the antifuse circuit to store the first repair address information after a power-up operation or the reset operation.

14. The apparatus of claim 11 further comprising a first fuse set and a second fuse set,
wherein the fuse controller is configured to activate the first fuse set in the second repair mode and further configured to activate the second fuse set in the first repair mode.

15. The apparatus of claim 14, further comprising a logic circuit configured to provide first status information indicative of whether the first fuse set is available and second status information indicative of whether the second fuse set is available, and
wherein the first fuse set is enabled when the first status information is indicative of the first fuse set being available, and
wherein the second fuse set is enabled when the first status information is indicative of the first fuse set being unavailable and the second status information is indicative of the second fuse set being available.

16. The apparatus of claim 15, wherein the logic circuit is configured to provide the first status information and the second status information responsive to fuse set usage information from the latch circuits of the first and second fuse sets.

17. The apparatus of claim 11, further comprising a plurality of fuse sets including a first fuse set and a second fuse set associated with a memory bank.

18. The apparatus of claim 17, wherein each fuse set of the plurality of fuse sets comprises a logic circuit configured to receive first status information whether each fuse set is available and further configured to provide a select signal to activate each fuse set,
wherein the first fuse set comprises a first logic circuit configured to provide a control signal based on the first information and the second fuse set comprises a second logic circuit configured to receive the control signal from the first logic circuit and further configured to provide the select signal to activate the second fuse set responsive, at least in part, to the control signal.

19. The apparatus of claim 17, further comprising an antifuse array circuit including a plurality of fuse cells corresponding to the plurality of fuse sets,
wherein each fuse cell includes an antifuse circuit coupled to a corresponding latch circuit in the corresponding fuse set.

20. The apparatus of claim 19, further comprising an antifuse array control circuit,
wherein the antifuse array control circuit includes a serial/parallel converter configured to receive the repair address from the latch circuit, and further configured to provide antifuse array selection signals to identify a fuse cell including an antifuse circuit corresponding to the repair address among the plurality of fuse cells.

* * * * *